(12) United States Patent
Newton, Jr. et al.

(10) Patent No.: US 6,969,130 B2
(45) Date of Patent: Nov. 29, 2005

(54) ENCLOSURE FOR ELECTRONIC DEVICES

(75) Inventors: Kenneth W. Newton, Jr., Southside, AL (US); Frederick James Diggle, Birmingham, AL (US); Paul Brent Rivers, Cullman, AL (US)

(73) Assignee: BellSouth Intellectual Property Corporation, Wilmington, DE (US)

( * ) Notice: Subject to any disclaimer, the term of this patent is extended or adjusted under 35 U.S.C. 154(b) by 211 days.

(21) Appl. No.: 10/436,170

(22) Filed: May 12, 2003

(65) Prior Publication Data
US 2004/0227437 A1 Nov. 18, 2004

(51) Int. Cl.⁷ .............................................. A47B 81/00
(52) U.S. Cl. .................. 312/223.1; 312/100; 312/328; 312/287; 49/104
(58) Field of Search ................... 174/50, 58; 220/4.02; 49/96, 109, 110, 111, 112, 107, 104, 108; 312/223.1, 287, 324, 326, 327, 328, 329, 312/319.2, 291, 100

(56) References Cited

U.S. PATENT DOCUMENTS

| | | | |
|---|---|---|---|
| 1,900,176 A * | 3/1933 | Flewell ........................ | 49/109 |
| 2,568,009 A | 9/1951 | Johnson | |
| 3,564,138 A * | 2/1971 | Harrold ........................ | 348/842 |
| 3,594,055 A * | 7/1971 | Lohr et al. ................... | 312/215 |
| 3,784,727 A * | 1/1974 | Haubein ...................... | 174/52.1 |
| 3,895,179 A * | 7/1975 | Wyatt .......................... | 174/50 |
| 4,371,757 A | 2/1983 | Debortoli et al. | |
| 4,600,254 A | 7/1986 | Whalen | |
| 4,644,095 A * | 2/1987 | Bright et al. ................. | 174/50 |
| 4,821,143 A * | 4/1989 | Holmgren et al. .......... | 361/605 |
| 4,967,924 A | 11/1990 | Murofushi et al. | |
| 5,127,715 A * | 7/1992 | Doyle et al. ................ | 312/9.46 |
| 5,148,348 A | 9/1992 | White | |
| 5,378,058 A | 1/1995 | Tessmer | |
| 5,465,528 A | 11/1995 | Schinzel et al. | |
| 5,476,316 A | 12/1995 | Batroney et al. | |
| 5,621,192 A | 4/1997 | Bordwell et al. | |
| 5,709,050 A * | 1/1998 | Benko ......................... | 49/109 |
| 5,779,083 A | 7/1998 | Bordwell | |
| 5,783,775 A | 7/1998 | Marusinec | |
| 5,901,868 A | 5/1999 | Fahey et al. | |
| 6,066,802 A | 5/2000 | Reinke et al. | |
| 6,075,207 A | 6/2000 | Sielaff et al. | |
| 6,229,707 B1 | 5/2001 | Keenan et al. | |
| 6,317,320 B1 | 11/2001 | Cosley et al. | |
| 6,382,749 B1 | 5/2002 | Stetson | |
| 6,494,252 B1 | 12/2002 | Takala et al. | |
| 6,708,703 B1 | 3/2004 | Rivers et al. | |
| 6,770,810 B2 * | 8/2004 | Wiebe et al. ................. | 174/50 |
| 6,806,422 B1 | 10/2004 | Rivers et al. | |
| 2004/0060584 A1 | 4/2004 | Diggle et al. | |
| 2004/0207299 A1 | 10/2004 | Diggle et al. | |

OTHER PUBLICATIONS

U.S. Appl. No. 10/285,075, filed Oct. 31, 2002.

* cited by examiner

*Primary Examiner*—Janet M. Wilkens
(74) *Attorney, Agent, or Firm*—Potomac Patent Group PLLC

(57) ABSTRACT

An electronic device enclosure is disclosed. According to one embodiment, the enclosure includes a housing and at least one door pivotally connected to the housing, wherein the door is pivotally moveable between a closed position and an open position about a first pivot axis. The enclosure also includes at least one shield connected to the housing, wherein the shield is pivotally moveable between a closed position and an open position about a second pivot axis, and wherein the shield is adapted to protect the enclosure from adverse environmental conditions.

6 Claims, 9 Drawing Sheets

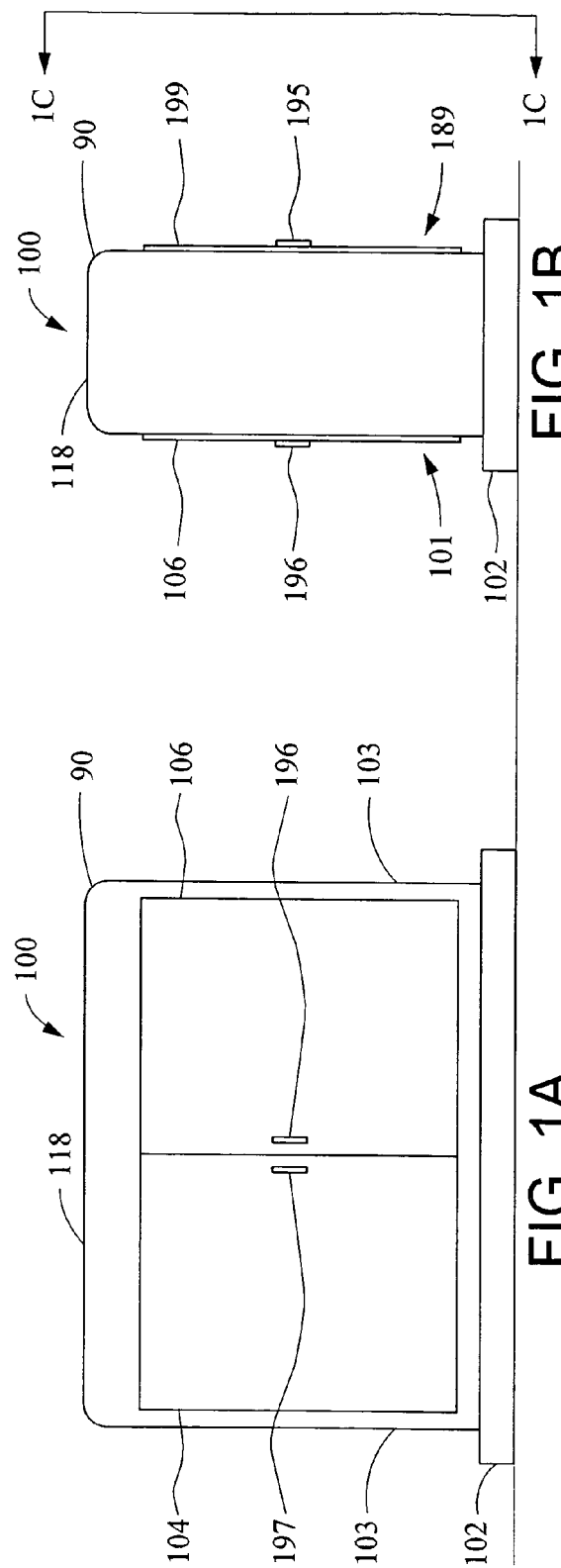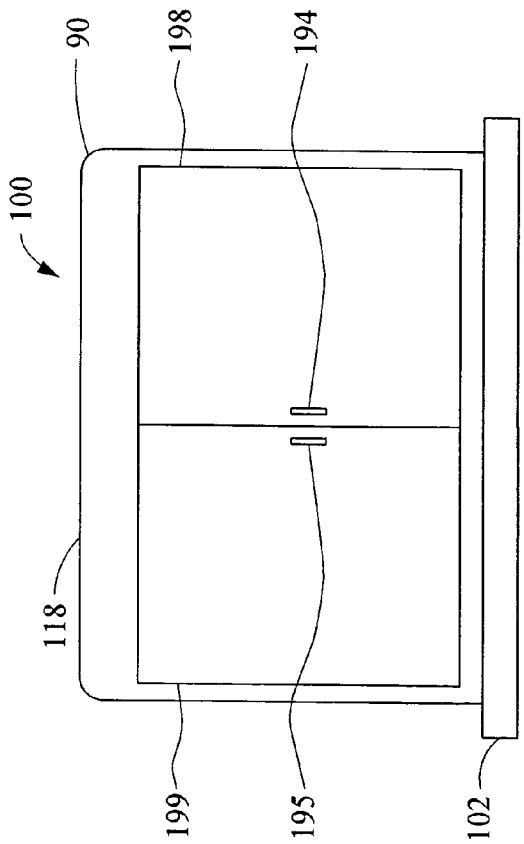

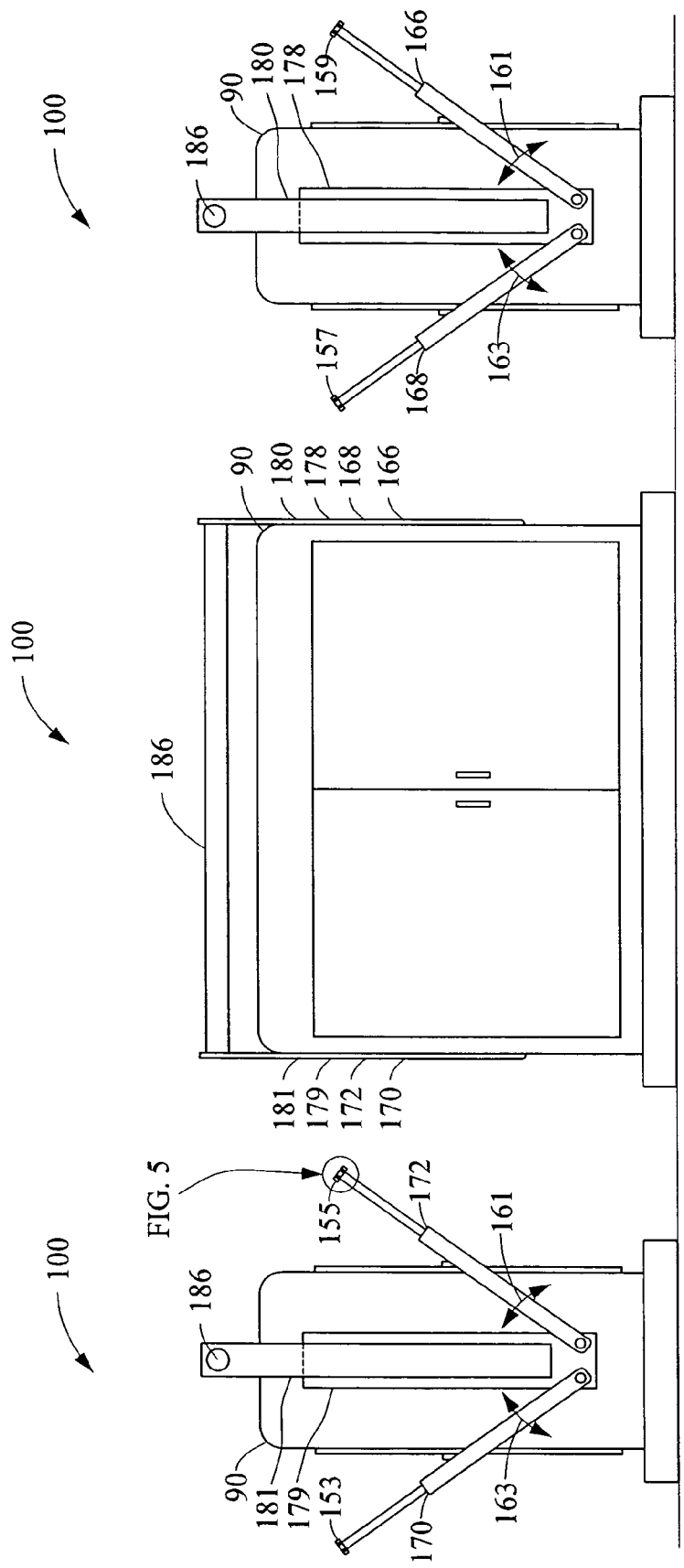

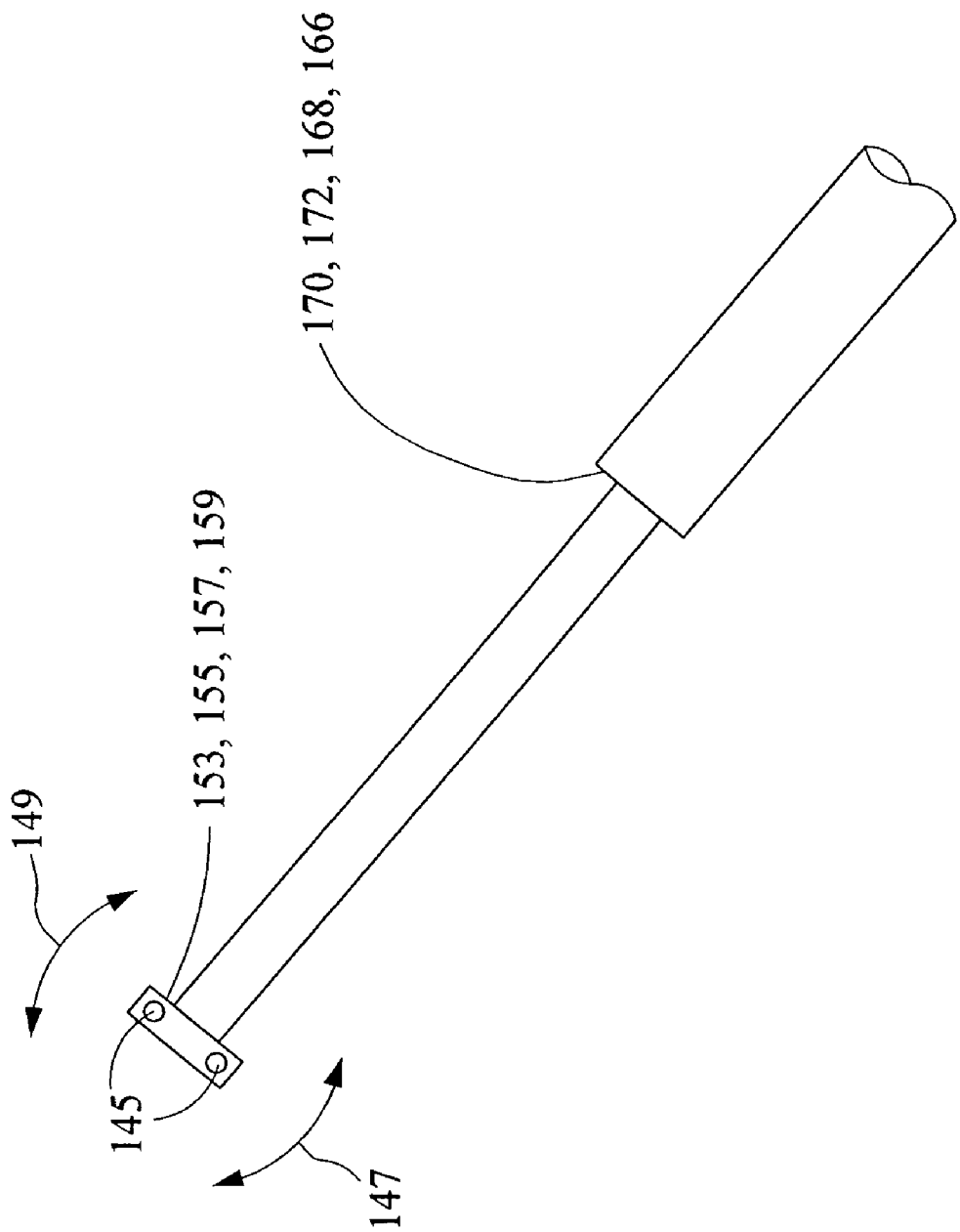

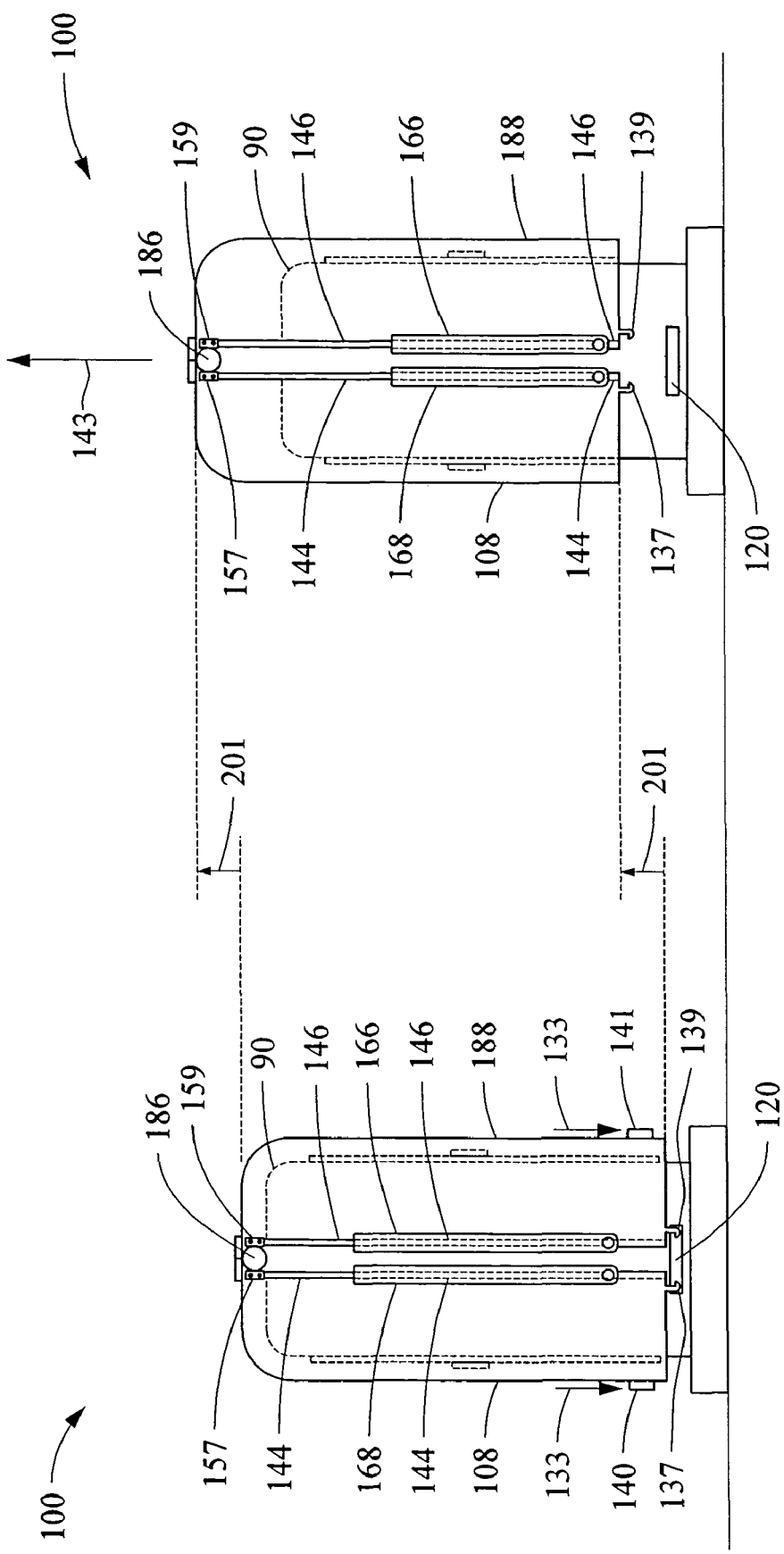

ENCLOSURE FOR ELECTRONIC DEVICES

BACKGROUND

In the telecommunication industry, it is common practice to locate electrical and electronic hardware devices and equipment outdoors. Generally, the devices and equipment are located in an accessible outdoor enclosure to protect them from electromagnetic radiation, and other environmental conditions such as, for example, rain, snow, hail, wind, sun, and other types of inclement or adverse weather conditions. To accomplish this objective, these enclosures may be formed in a variety of shapes and may be made from a variety of materials such as, for example, metal, polymer, plastic, ceramic, glass, crystal, and/or combinations thereof.

When it is necessary to perform service on the electrical and/or electronic devices contained in the outdoor enclosure, technicians must provide the service at the site in which the enclosure is located. Thus, when service is required during inclement weather, a chance exists that any electrical equipment and/or electronic hardware devices located in the outdoor enclosure will be adversely affected by inclement weather conditions such as, for example, rain, snow, hail, windblown dust or dirt, etc. In addition, the technician, who is servicing the device and/or equipment, also needs to be protected from such adverse weather conditions.

Therefore, when the technician is servicing the electrical and/or electronic hardware devices and equipment contained in the outdoor enclosure during equipment upgrades, testing, maintenance, service outage problems, and/or other service requirements, the technician and the electrical devices and equipment must be protected to prevent them from becoming adversely affected by adverse weather conditions. In addition, the devices and equipment must be protected to prevent them from degrading over time. Failure to limit the electrical and/or electronic hardware devices and equipment to weather exposure can result in increased labor and equipment costs attributable to more frequent repairs and replacement of the electrical equipment and/or electronic hardware devices located in the enclosure than would otherwise be necessary.

SUMMARY

In one general respect, one embodiment of the present invention is directed to an electronic device enclosure. According to this embodiment, the enclosure includes a housing and at least one door pivotally connected to the housing, wherein the door is pivotally moveable between a closed position and an open position about a first pivot axis. The enclosure also includes at least one shield connected to the housing, wherein the shield is pivotally moveable between a closed position and an open position about a second pivot axis, and wherein the shield is adapted to protect the enclosure from adverse environmental conditions.

DESCRIPTION OF THE DRAWINGS

Embodiments of the present invention are described herein in conjunction with the following figures, wherein:

FIGS. 1A–1F are front, side and back views of an enclosure according to one embodiment of the present invention;

FIGS. 4A–4C are front and side views of an enclosure according to one embodiment of the present invention;

FIG. 5 is a detailed view of a bracket according to one embodiment of the present invention;

FIGS. 6A–6B are side views of an enclosure according to one embodiment of the present invention;

DESCRIPTION

Figure 1E:
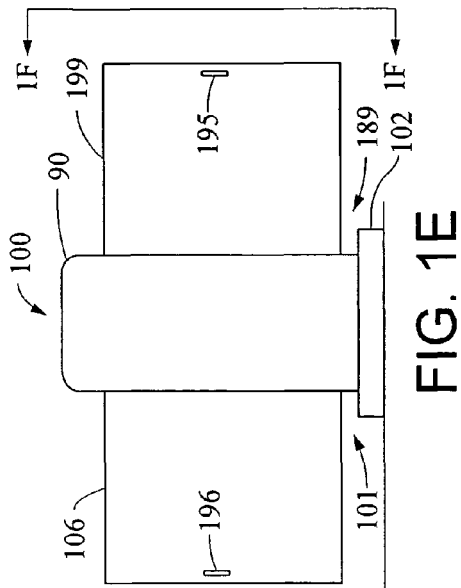

Referring now to the several drawings in which identical elements are numbered identically throughout, a description of the enclosure now will be provided, in which exemplary embodiments are shown in the several figures. The enclosure may, however, be embodied in many different forms and should not be construed as limited to the embodiments set forth herein. Rather, these embodiments are provided so that this disclosure will be thorough and complete, and will fully convey the scope of the invention to those having ordinary skill in the art.

In addition, those skilled in the art will appreciate that the term "enclosure" as used herein comprises terminals, closures, housings, cabinets, and other devices and structures and the like that may be used to place electrical and/or electronic hardware devices, components, and/or equipment or the like in outdoor environments. Furthermore, the term "electronic devices" as used herein may comprise electrical hardware devices, electronic hardware devices, electrical components, circuit boards, telecommunications equipment, and the like and/or any other equipment located in outdoor environments.

All statements herein reciting embodiments of the present invention, as well as specific examples thereof, are intended to encompass both structural and functional equivalents thereof. Moreover, it is intended that such equivalents include both currently known equivalents as well as equivalents developed in the future for performing the same function, regardless of structure. Thus, those skilled in the art will appreciate that the drawings presented herein and the like, represent conceptual views of illustrative structures which may embody the various aspects of this invention.

It is to be understood that the figures and descriptions of the enclosure have been simplified to illustrate elements that are relevant for a clear understanding of the enclosure, while eliminating, for purposes of clarity, other elements of a conventional enclosure. For example, conventional enclosures include certain mounting brackets, latches, stops, and hinges that are not described herein. Those of ordinary skill in the art will recognize, however, that these and other elements may be desirable in a typical enclosure. However, because such elements are well known in the art and because they do not facilitate a better understanding of the enclosure, a discussion of such elements is not provided herein.

Also, in the claims appended hereto, any element expressed as a means for performing a specified function is to encompass any way of performing that function including, for example, a combination of elements that perform that function. Furthermore the invention, as defined by such means-plus-function claims, resides in the fact that the functionalities provided by the various recited means are combined and brought together in the manner that the claims called for. Therefore, any means that can provide such functionalities may be considered equivalents to the means shown herein.

FIGS. 1–8 illustrate embodiments of an enclosure. Although the specific embodiments of the several example enclosures described herein comprise a substantially rectangular polygonal shape, the scope of the present invention is intended to encompass enclosures having any shape or form for performing the function of containing and/or protecting the electronic devices contained within the enclosure regardless of shape or size.

Figure 1D:
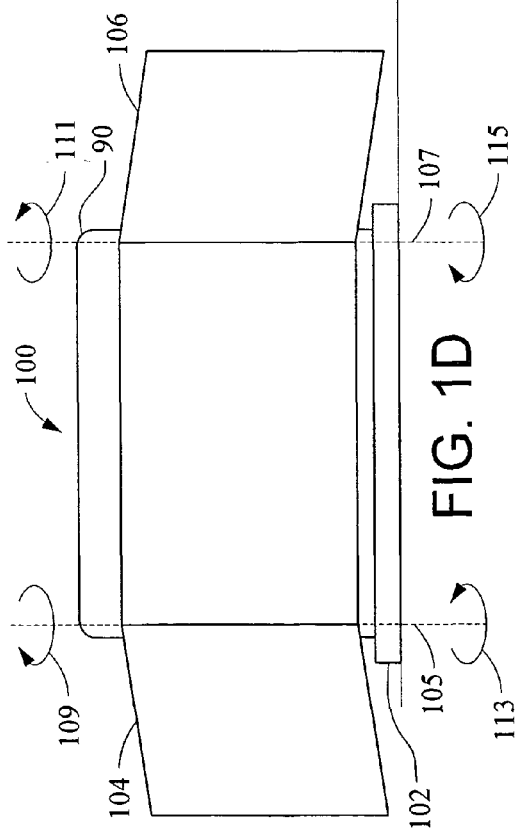
Figure 1F:
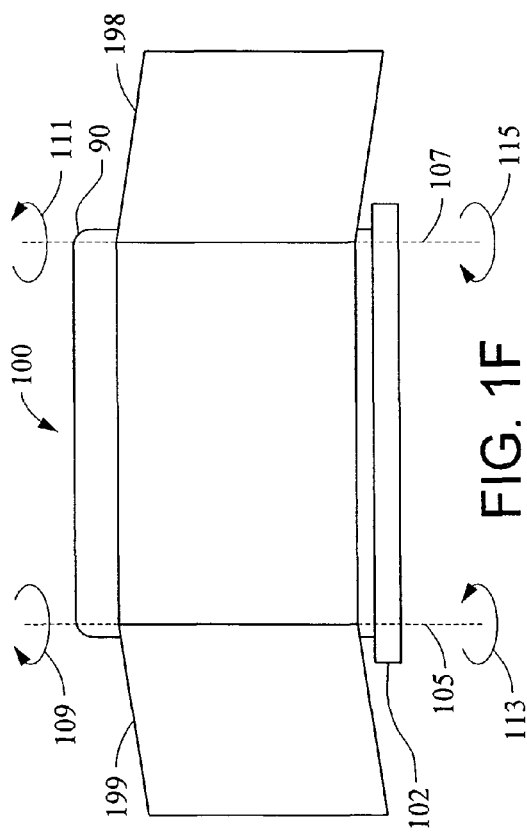

FIGS. 1A, 1B, and 1C illustrate a front, side and back view of the enclosure 100, respectively, with access doors 104, 106, 198, 199 in the closed position. FIGS. 1D, 1E, and 1F illustrate a front, side and back view of the enclosure 100, respectively, with access doors 104, 106, 198, 199 in the open position.

With reference to FIGS. 1A–1F, one embodiment of the present invention includes an enclosure 100 which may be secured to a surface such as a concrete pad 102. The enclosure 100 may be formed from a variety of suitable materials that can withstand various outdoor environmental conditions. As used herein, "environmental conditions" include, but are not limited to, a wide range of ambient temperatures, humidity, moisture, rain, sleet, snow, ice, and airborne or windblown sand, dust and dirt prevalent in typical outdoor environments.

The enclosure 100 may be formed from any suitable engineering material such as, for example, metal, alloy, plastic, or ceramic used in the fabrication of machinery, machinery components, structural shapes, tools, instruments, and other items. Their hardness, strength, machinability, dimensional stability, nonflammability, and resistance to corrosion, acids, solvents, and heat may characterize the properties of such suitable engineering materials. Examples of such suitable engineering materials include, but are not limited to, metals and alloys such as aluminum, beryllium, brass, bronze, cast iron, copper, lead, magnesium, steel, tantalum, zinc, zirconium, and various other trademarked alloys; ceramics such as glass and porcelain; and plastics such as ABS resin, acetal resin, acrylic resin, fluorocarbon polymer, nylon, phenolformaldehyde resin, polybutilene terephthalate, polycarbonate, polyethylene, polyphenylene oxide, polypropylene, polystyrene, polyvinyl chloride, reinforced plastics (FRP), and ureaformaldehyde resin. The enclosure 100 also may be formed from any of the engineering materials recited above, and/or any combinations thereof, with appropriate coatings adequate to withstand outdoor environmental conditions. In one embodiment of the present invention, the enclosure 100 may, for example, be formed of G90 galvanized steel having a durable finish coating, such as a polyurethane powder coating.

In one embodiment of the present invention, the enclosure 100 may include, for example, a housing 90 having at least one access door 106 at a front portion 101 of the enclosure 100, a top portion 118, and a pair of sidewalls 103. In other embodiments, the housing 90 may include a second access door 104 or a plurality of access doors at the front portion 101. The access doors 104, 106 may be pivotally attached to the housing 90 with one or more hinges (not shown) such that the access doors 104, 106 may, for example, be pivotally movable from an open position (as shown in FIG. 1D) to a closed position (as shown in FIG. 1A) about pivot axes 105 and 107, respectively.

In one embodiment of the present invention, the access doors 104, 106 may pivot about axes 105, 107, respectively, such that they may be rotated, revolved, swiveled, or spun to an open position in the direction shown by arrows 109 and 111, respectively. Conversely, the access doors 104 and 106 may pivot about axes 105 and 107, respectively, such that they may be rotated, revolved, swiveled, or spun to the closed position in the direction shown by arrows 113, 115, respectively. In addition, the doors 104, 106 may be in an overlapping arrangement when they are in a closed position.

According to this embodiment, the access doors 104, 106 may be opened and closed, for example, by a service technician accessing door handles 196, 197. The door handles 196, 197 may be integrated into the design of the access doors 104, 106 via cutouts or embossed raised surfaces, for example. In other embodiments, the door handles 196, 197 may be separately mounted to the access doors 104, 106 by fastening means such as, for example, rivets, bolts, screws, and/or various welding methodologies. Like the housing 100, the door handles 196, 197 may be formed from any weather resistant material such as coated metal, alloy, plastic, or ceramic.

In another embodiment of the present invention, the enclosure 100 may include a plurality of access doors 104, 106, 198, 199 and door handles 194, 195, 196, 197 that provide for multiple access to the enclosed electronic devices from at least two sides of the enclosure 100 such as, for example, providing access from the front portion 101 and the rear portion 189 of the enclosure 100. According to this embodiment, the access door 198, 199 would operate, open, and close in a similar fashion as access doors 104, 106 (described above) and door handles 194, 195 would be mounted to the access doors and formed from materials similar to door handles 196, 197 (described above).

Figure 2B:
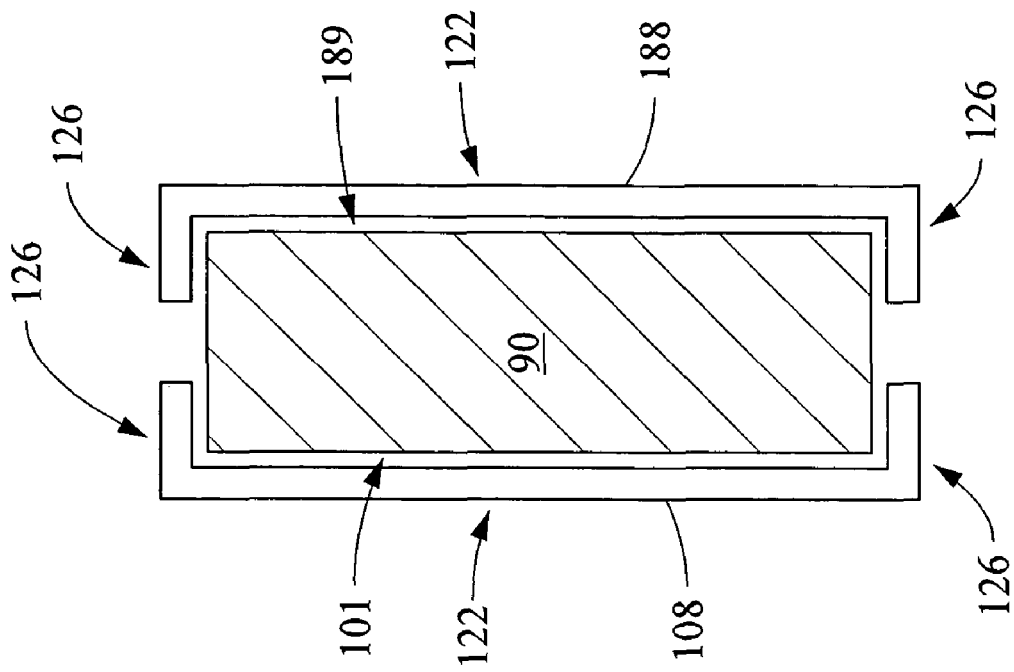
FIGS. 2A and 2B are a side view and a bottom cross-section view, respectively, of an enclosure according to one embodiment of the present invention.
Figure 2A:
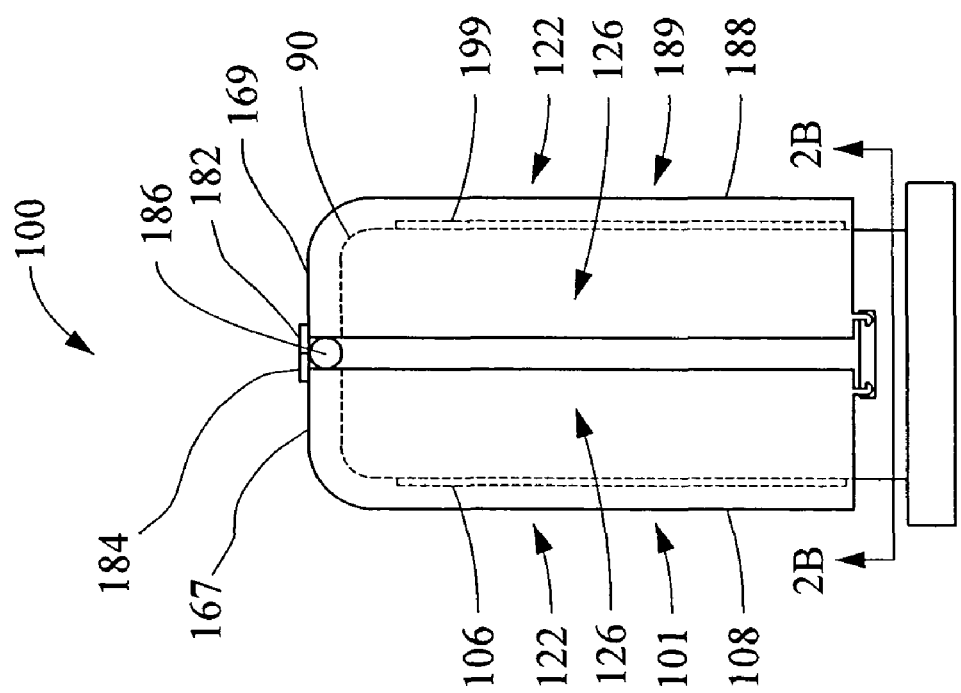
Figure 7:
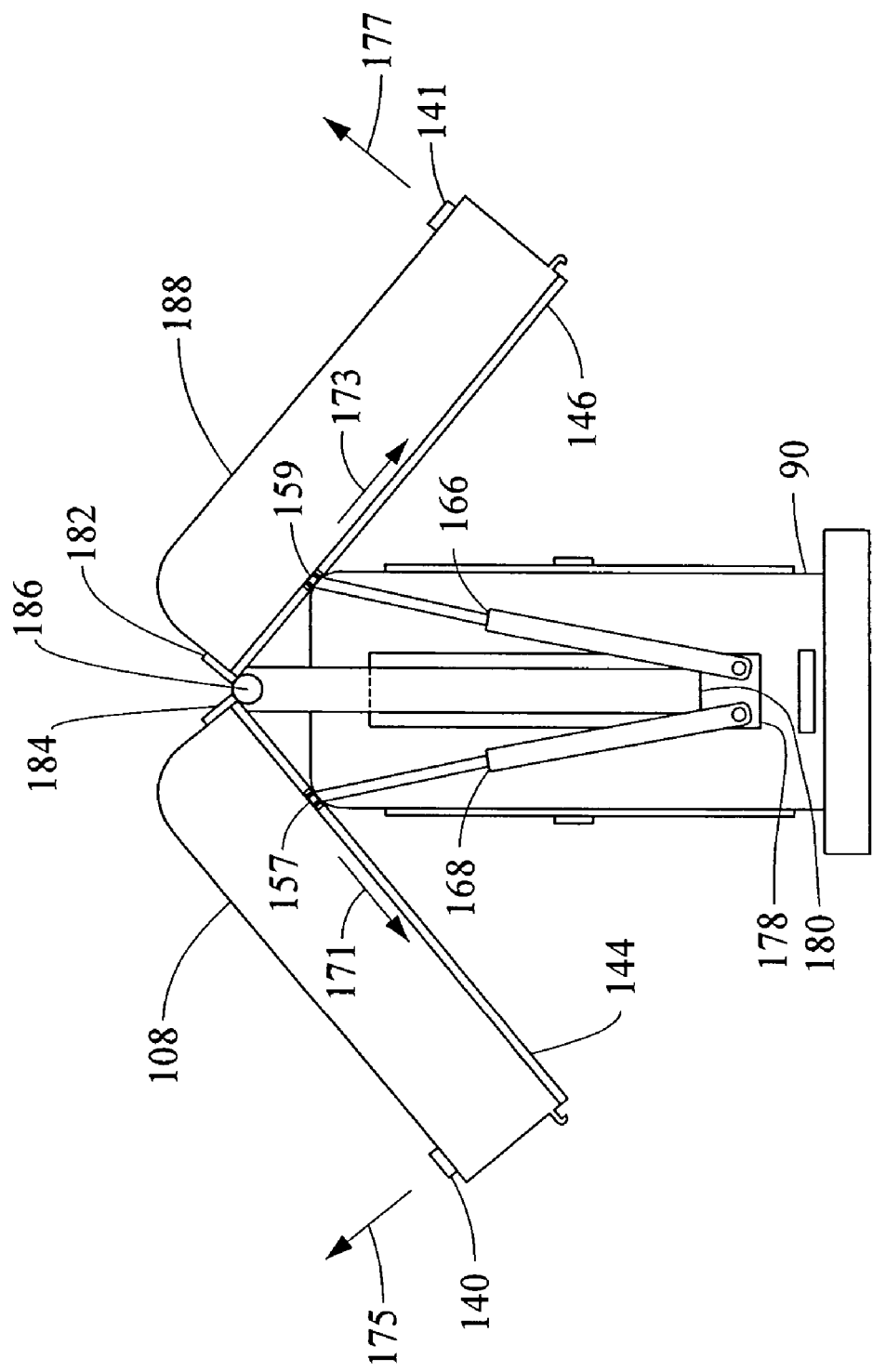
FIG. 7 is a side view of an enclosure according to one embodiment of the present invention.
Figure 8:
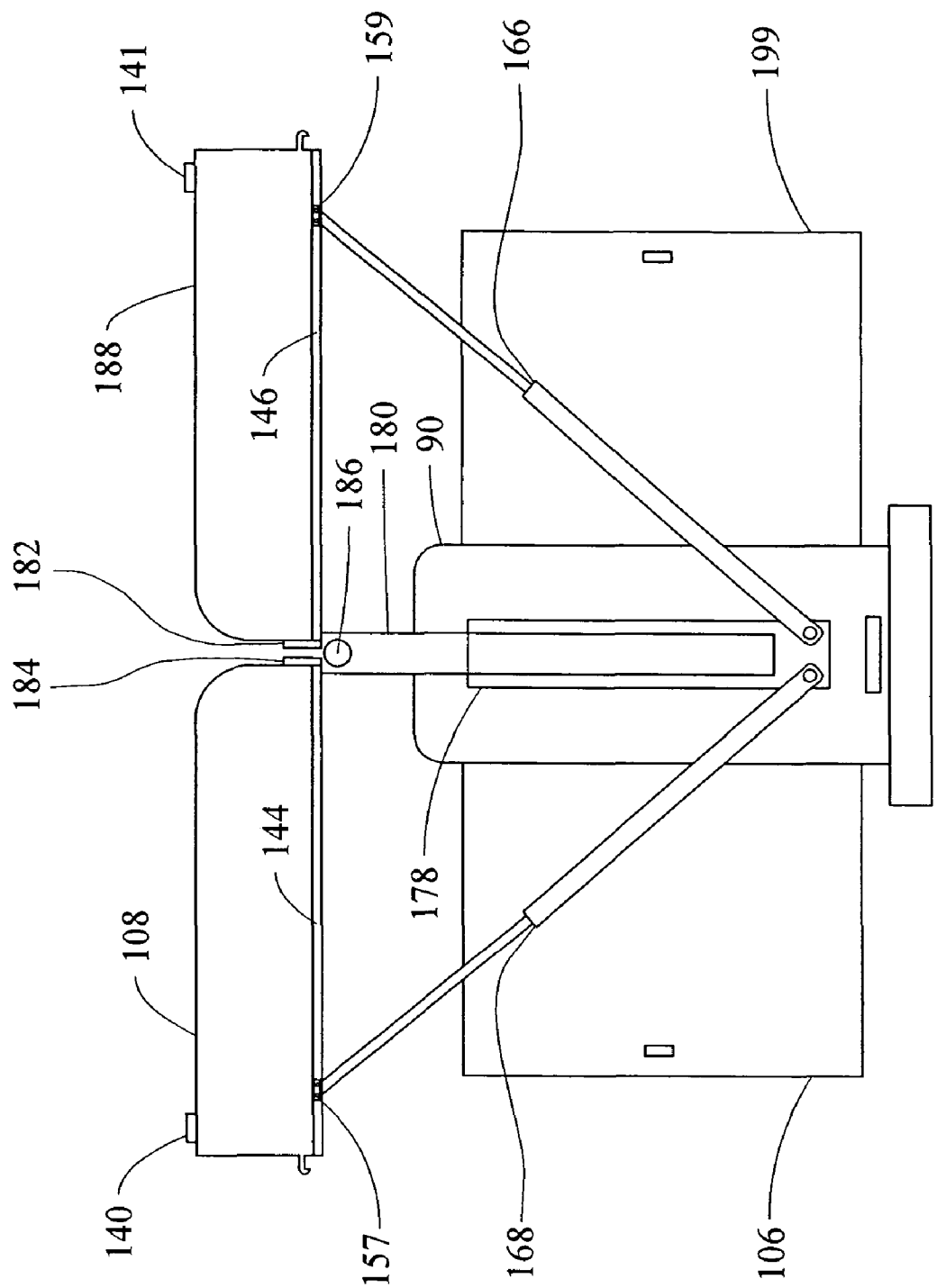
FIG. 8 is a side view of an enclosure according to one embodiment of the present invention.

FIG. 2A illustrates a side view of the enclosure 100 in accordance with one embodiment of the present invention with shields 108, 188 shown deployed in a closed position. According to this embodiment, the enclosure 100 may include at least one shield 108, and in another embodiment, the enclosure 100 may also include a second shield 188. The shields 108, 188 may, for example, include a U-channel body having a top surface 167, 169 and first, second, and third lateral portions. In addition, the shields 108, 188 may be pivotally attached to a crossbar 186 (further described in FIG. 3) with one or more hinges such as, for example, hinges 182, 184, which may be mounted to the cross bar 186 and the shields 108, 188 by welding, bolts, screws, rivets, clamps, magnets, epoxy, glue, cement, adhesives, and other means of attachment. The hinges 182, 184 may attach to the crossbar 186 to define a pivot axis about which shields 108, 188 may be rotated, revolved, swiveled, or spun to an open position (as shown in FIGS. 7 and 8) and a closed position (as shown in FIG. 2A).

FIG. 2B illustrates a bottom cross-section view of the enclosure 100 according to one embodiment of the present invention. According to this embodiment, the shields 108, 188 may, for example, include U-channel bodies with shield 108 having a first lateral portion 122 and a second and third lateral portion 126 that straddle the front portion 101 of the enclosure 100, and shield 188 having a first lateral portion 122 and a second and third lateral portion 126 that straddle the rear portion 189 of the enclosure 100.

In accordance with one embodiment of the present invention, the enclosure 100 may include a conventional telecommunications cabinet 90 adapted with shields 108, 188. The Universal Series Cross-Cabinet manufactured by Marconi Communications is one example of a telecommunications cabinet 90 that can be adapted and/or fitted with the shields 108, 188 in accordance with one embodiment of the present invention. Nevertheless, a variety of enclosures comprising cabinets fitted with shields may be used to implement various embodiments of the present invention.

Those skilled in the art will also appreciate that the shields 108, 188 may be formed from any suitable engineering material such as, for example, glass fiber, metal, alloy, plastic, or ceramic used in the fabrication of machinery, machinery components, structural shapes, tools, instruments, and other items. Their hardness, strength, machinability, dimensional stability, nonflammability, and resistance to corrosion, acids, solvents, and heat may characterize the properties of such suitable engineering materials. Examples of such suitable engineering materials include, but are not limited to, metals and alloys such as aluminum, beryllium, brass, bronze, cast iron, copper, lead, magnesium, steel, tantalum, zinc, zirconium, and various other trademarked alloys; ceramics such as glass and porcelain; and plastics such as ABS resin, acetal resin, acrylic resin, fluorocarbon polymer, nylon, phenolformaldehyde resin, polybutilene terephthalate, polycarbonate, polyethylene, polyphenylene oxide, polypropylene, polystyrene, polyvinyl chloride, reinforced plastics (FRP), and ureaformaldehyde resin. The shields 108, 188 also may be formed from any of the engineering materials recited above, and/or any combinations thereof, with appropriate coatings adequate to withstand outdoor environmental conditions. In one embodiment of the present invention, the shields 108, 188 may, for example, be formed of G90 galvanized steel having a durable finish coating, such as a polyurethane powder coating. In other embodiments of the present invention, the shields 108, 188 may be formed from light-weight materials and also may be formed from non-electrically-conductive materials.

Although the shields 108, 188 are generally depicted throughout the various views as having a U-channel body, the present invention is not intended to be limited to shields 108, 188 having only a U-channel body. For example, the shields 108, 188 may be formed in a clam shape or a variety of other shapes suitable for performing the intended function of shielding the technician and/or the electronic devices from adverse environmental conditions.

Figures 3A, 3B, 3C:
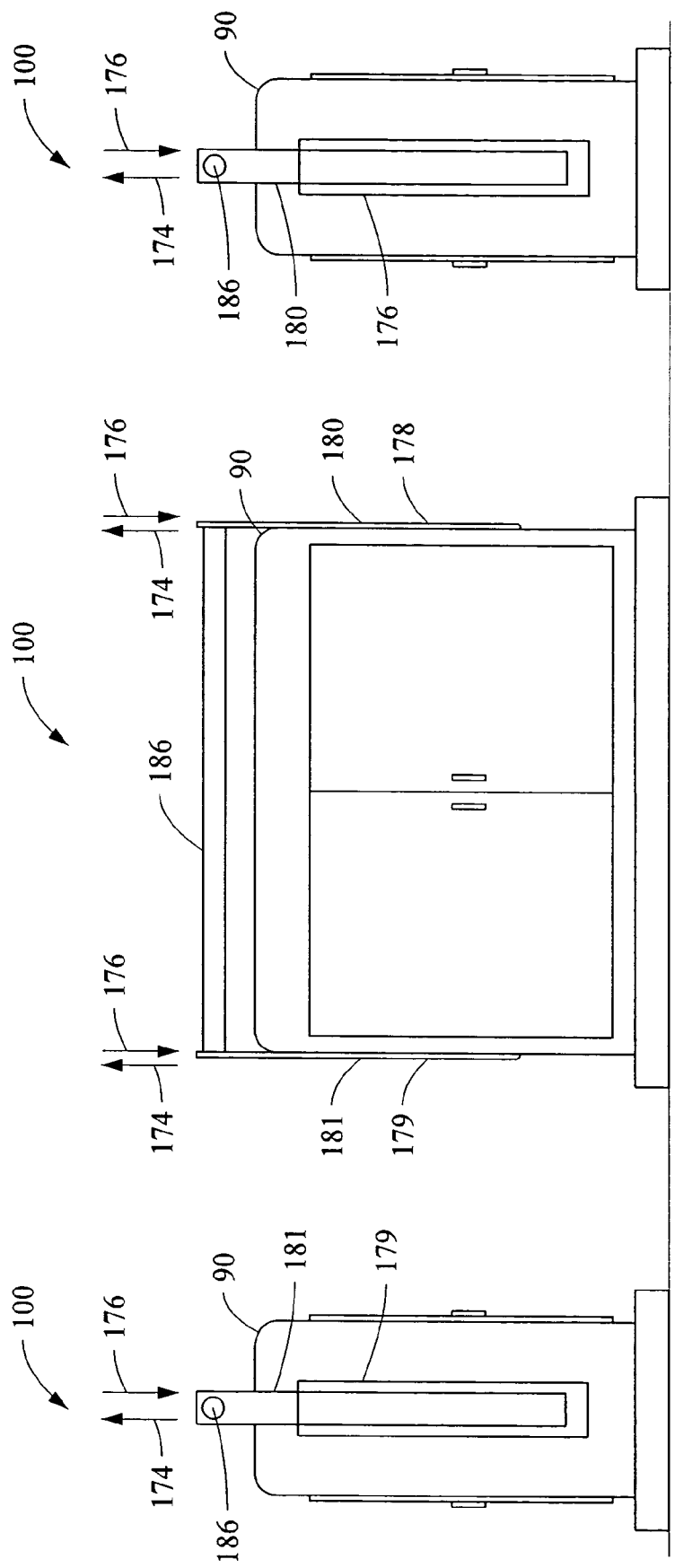
FIGS. 3A–3C are front and side views of an enclosure according to one embodiment of the present invention.

FIGS. 3A and 3C illustrate first and second side views of the enclosure 100, and FIG. 3B illustrates a front view of the enclosure 100 in accordance with one embodiment of the present invention. As illustrated therein, the housing 90 may include at least two retrackable side brackets 180, 181 that are inserted into at least two fixed side brackets 178, 179, which are mounted on each side of the housing 90. According to this embodiment, the fixed side brackets 178, 179 may be attached to each side of the housing 90 by welding, bolts, screws, rivets, clamps, magnets, epoxy, glue, cement, adhesives, and other means of attachment. In one embodiment, the retrackable side brackets 180, 181 may be attached to the crossbar 186 by welding, bolts, screws, rivets, clamps, magnets, epoxy, glue, cement, adhesives, and other means of attachment. In addition, the crossbar 186 may be attached to the shields 108, 188 (not shown) via hinges as described above.

In another one embodiment, the fixed side brackets 178, 179 may, for example, be in the shape of U-channel bodies into which the retrackable side brackets 180, 181 may be inserted. In addition, the retrackable side brackets 180, 181 may, for example, include bearings (not shown) that enable the retrackable side brackets 180, 181 to move freely within the U-shape channel of the fixed side brackets 178, 179. According to this embodiment, the bearings (not shown) may be, for example, neoprene wheels or any other engineering material that minimizes contact friction.

In one embodiment of the present invention, the retrackable side brackets 180 may be directed in an upward direction shown by arrow 174 and/or a downward direction shown by arrow 176. As the retrackable side brackets 180 are directed in the upward direction 174 and/or the downward direction 176, the crossbar 178 and the shields 108, 188 (not shown), which are attached thereto, will move in like fashion and thus allow for additional clearance height for a technician to service the electronic devices that are located in the enclosure 100 once the shields 108, 188 (not shown) are located in the open position (as shown in FIG. 8).

In another embodiment, the enclosure 100 may not include retrackable side brackets 180, 181 but only fixed side brackets 178, 179 that may be attached to the crossbar 186 by welding, bolts, screws, rivets, clamps, magnets, epoxy, glue, cement, adhesives, and other means of attachment. In addition, the crossbar 186 may be attached to the shields 108, 188 (not shown) via hinges as described above. According to this embodiment, the crossbar 178 and the shields 108, 188 (not shown) may not be able to travel in the upward direction 174 and/or the downward direction 176 and thus may not allow for an additional clearance height for a technician to service the electronic devices inside the enclosure 100 once the shields 108, 188 are located in the open position.

FIGS. 4A and 4C illustrate first and second side views of the enclosure 100, respectively, and FIG. 4B illustrates a front view of the enclosure 100 in accordance with one embodiment of the present invention. As illustrated therein, housing 90 may include one or more track compression members 166, 168, 170, 172 that are mounted on at least one side of the housing 90 and that assist in opening and supporting the shields 108, 188 (not shown). According to this embodiment, the track compression members 166, 168, 170, 172 may, for example, be pivotally attached to each side of the housing 90 with bolts, screws, rivets, clamps, magnets, and other like means of attachment and pivotally moveable in a direction shown by arrows 163 and 161 as the shields 108, 188 travel from a closed position (as shown in FIG. 6A) to an open position (as shown in FIGS. 7–8) and as the shields 108, 188 travel from the open position to the closed position.

In one embodiment of the present invention, the track compression members 166, 168, 170, 172 may, for example, be hydraulic, pneumatic, or spring-charged, elastic components whose potential energy is at a maximum when an applied force compresses the members to their shortest length without causing permanent deformation, thus causing the track compression members 166, 168, 170, 172 to be in a "charged" condition. The track compression members 166, 168, 170, 172 may be subject to such a compressive force when the shields 108, 188, for example, are in a closed and latched position (as shown in FIG. 6A). Once charged, the track compression members 166, 168, 170, 172 may, for example, be released and utilized in assisting a service technician in opening the shields 108, 188 and supporting the shields 108, 188 once the shields 108, 188 are in the open position.

Those skilled in the art will also appreciate that the track compression members 166, 168, 170, 172 may be formed from any suitable engineering material such as, for example, metal, alloy, plastic, or ceramic used in the fabrication of machinery, machinery components, structural shapes, tools, instruments, and other items. Their hardness, strength, machinability, dimensional stability, nonflammability, and resistance to corrosion, acids, solvents, and heat may characterize the properties of such suitable engineering materials. Examples of such suitable engineering materials include, but are not limited to, metals and alloys such as aluminum, beryllium, brass, bronze, cast iron, copper, lead, magnesium, steel, tantalum, zinc, zirconium, and various other trademarked alloys; ceramics such as glass and porcelain; and plastics such as ABS resin, acetal resin, acrylic resin, fluorocarbon polymer, nylon, phenolformaldehyde resin, polybutilene terephthalate, polycarbonate, polyethylene, polyphenylene oxide, polypropylene, polystyrene, polyvinyl chloride, reinforced plastics (FRP), and ureaformaldehyde resin. The track compression members 166, 168, 170, 172 also may be formed from any of the engineering materials recited above, and/or any combinations thereof, with appropriate coatings adequate to withstand outdoor environmental conditions. In one embodiment of the present invention, the track compression members 166, 168, 170, 172 may, for example, be formed of G90 galvanized steel having a durable finish coating, such as a polyurethane powder coating.

FIG. 5 is a detailed view of the bearing brackets 153, 155, 157, 159 located on each of the track compression members 166, 168, 170, 172. In one embodiment of the present invention, the track compression members 166, 168, 170, 172 may include, for example, one or more bearing brackets 153, 155, 157, 159 for coupling the track compression members 166, 168, 170, 172 to the shields 108, 188.

According to this embodiment, the bearing brackets 153, 155, 157, 159 may, for example, be pivotally attached to the track compression members 166, 168, 170, 172 with bolts, screws, rivets, clamps, magnets, and other means of attachment such that the bearing brackets 153, 155, 157, 159 are pivotally moveable in the direction shown by arrows 147 and 149 as the shields 108, 188 travel from a closed position (shown in FIG. 6A) to an open position (shown in FIGS. 7–8) and as the shields 108, 188 travel from the open position to the closed position. In one embodiment, the bearing brackets 153, 155, 157, 159 may include one or more bearings 145 such as, for example, roller bearings or other means that rotate, slide, or oscillate on a surface so as to minimize contact friction.

Those skilled in the art will also appreciate that the bearing brackets 153, 155, 157, 159 may be formed from any suitable engineering material such as, for example, metal, alloy, plastic, or ceramic used in the fabrication of machinery, machinery components, structural shapes, tools, instruments, and other items. Their hardness, strength, machinability, dimensional stability, nonflammability, and resistance to corrosion, acids, solvents, and heat may characterize the properties of such suitable engineering materials. Examples of such suitable engineering materials include, but are not limited to, metals and alloys such as aluminum, beryllium, brass, bronze, cast iron, copper, lead, magnesium, steel, tantalum, zinc, zirconium, and various other trademarked alloys; ceramics such as glass and porcelain; and plastics such as ABS resin, acetal resin, acrylic resin, fluorocarbon polymer, nylon, phenolformaldehyde resin, polybutilene terephthalate, polycarbonate, polyethylene, polyphenylene oxide, polypropylene, polystyrene, polyvinyl chloride, reinforced plastics (FRP), and ureaformaldehyde resin. The bearing brackets 153, 155, 157, 159 also maybe formed from any of the engineering materials recited above, and/or any combinations thereof, with appropriate coatings adequate to withstand outdoor environmental conditions. In one embodiment of the present invention, the bearing brackets 153, 155, 157, 159 may, for example, be formed of G90 galvanized steel having a durable finish coating, such as a polyurethane powder coating.

FIG. 6A is a side view of the enclosure 100 in accordance with one embodiment of the present invention with the shields 108, 188 shown deployed in a closed and latched position at a latch member 120. FIG. 6B is a side view of the enclosure 100 in accordance with one embodiment of the present invention with the shields 108, 188 shown deployed in a closed and unlatched position.

In one embodiment of the present invention, the latch hooks 137, 139 may, for example, be fabricated into the shields 108, 188 as an integral part of the design. However, in other embodiments, the latch hooks 137, 139 may, for example, be attached to the shields 108, 188 by welding, bolts, screws, rivets, clamps, magnets, epoxy, glue, cement, adhesives, and other means of attachment.

In one embodiment of the present invention, the latch hooks 137, 139 may, for example, engage the latch member 120 when a downward force 133 is applied to the shield handles 140, 141, thus causing the shields 108, 188 to be in a closed and latched position (as shown in FIG. 6A). According to this embodiment, the latch member 120 may include, for example, spring-loaded mechanisms (not shown) that capture the latch hooks 137, 139 as the latch hooks 137, 139 come in contact with the latch member 120. In accordance with this embodiment, the shields 108, 188 may function not only to protect the technician and the electronic devices located inside the enclosure 100 from adverse weather conditions, but also the shields 108, 188 may be locked in the closed position by means of a key interface (not shown), thus preventing unauthorized access to the electronic devices inside the enclosure 100.

In one embodiment of the present invention, the shield handles 140, 141 may be integrated into the design of the shields 108, 188 via cutouts or embossed raised surfaces, for example. In other embodiments, shield handles 140, 141 may be separately mounted to the shields 108, 188 by fastening means such as, for example, rivets, bolts, screws, and/or various welding methodologies.

In another embodiment of the present invention, the latch member 120 may include, for example, spring-loaded mechanisms (not shown) that are interlocked with a key release (not shown) such that, when the key release is engaged, the spring-loaded mechanisms are directed away from the latch hooks 137, 139, thus causing the stored energy in the track compression members 166, 168 to be released (as shown in FIG. 6B). As the stored energy is released, the track compression members 166, 168 extend upward causing the bearing brackets 157, 159 to travel in the shield rails 144, 146 and apply an upward force 143 to the ends of the shield rails 144, 146. Once the upward force 143 is applied to the ends of the shield rails 144, 146, the shields 108, 188 will raise a distance (depicted by arrows 201) and thus allow for additional clearance height for a technician to service the electronic devices inside the enclosure 100 once the shields 108, 188 are located in the open position (as shown in FIG. 8).

Those skilled in the art will also appreciate that the latch hooks 137, 139, the latch member 120, and the shield handles 140, 141 may be formed from any suitable engineering material such as, for example, metal, alloy, plastic, or ceramic used in the fabrication of machinery, machinery components, structural shapes, tools, instruments, and other items. Their hardness, strength, machinability, dimensional stability, nonflammability, and resistance to corrosion, acids, solvents, and heat may characterize the properties of such suitable engineering materials. Examples of such suitable engineering materials include, but are not limited to, metals and alloys such as aluminum, beryllium, brass, bronze, cast iron, copper, lead, magnesium, steel, tantalum, zinc, zirconium, and various other trademarked alloys; ceramics such as glass and porcelain; and plastics such as ABS resin, acetal resin, acrylic resin, fluorocarbon polymer, nylon, phenol-formaldehyde resin, polybutilene terephthalate, polycarbonate, polyethylene, polyphenylene oxide, polypropylene, polystyrene, polyvinyl chloride, reinforced plastics (FRP), and ureaformaldehyde resin. The latch hooks 137, 139, the latch member 120, and the shield handles 140, 141 also may be formed from any of the engineering materials recited above, and/or any combinations thereof, with appropriate coatings adequate to withstand outdoor environmental conditions. In one embodiment of the present invention, the latch hooks 137, 139, the latch member 120, and the shield handles 140, 141 may, for example, be formed of G90 galvanized steel having a durable finish coating, such as a polyurethane powder coating.

FIG. 7 is a side view of the enclosure 100 in accordance with one embodiment of the present invention with the shields 108, 188 shown being transitioned from a closed position to an open position. According to this embodiment, after the shields 108, 188 have been unlatched from the closed and latched position (as shown by FIG. 6B), an upward force 175, 177 may be applied to at least one of the shield handles 140, 141, thus causing one or more of the shields 108, 188 to pivot about the crossbar 186 and raise upward such as, for example, when a service technician exerts a force 175, 177 in attempting to raise one or more of the shields 108, 188.

According to one embodiment of the present invention, the upward forces 175, 177 may, for example, trigger the track compression members 166, 168 to exert a force on the bearing brackets 157, 159, thus causing the bearing brackets 157, 159 to slide in the shield rails 144, 146 in the direction shown by arrows 171 and/or 173. As the track compression members 166, 168 drive the bearing brackets 157, 159 towards the ends of the shield rails 144, 146, the shields 108, 188 raise upward. Therefore, according to this embodiment, the track compression members 166, 168 may assist the upward forces 175, 177 in opening the shields 108, 188 and supporting the shields 108, 188 once the shields 108, 188 are located in the open position.

Although FIG. 7 depicts an embodiment as having the two shields 108, 188 open and/or close in tandem, those skilled in the art will appreciate that the shields 108, 188 may operate independently of one another. For example, a service technician may raise shield 108 by applying an upward force 175 on shield handle 140, while still having shield 188 remain in the closed position.

FIG. 8 is a side view of the enclosure 100 in accordance with one embodiment of the present invention with the shields 108, 188 and access doors 106, 199 shown deployed in an open position. According to this embodiment, the track compression members 166, 168 may, for example, exert a force that drives the bearing brackets 157, 159 toward the end of the shield rails 144, 146, respectively, thus enabling the shields 108, 188 to remain in the open position.

Once in the shields 108, 188 and access doors 106, 199 are located in the open position, a technician may, for example, service the electronic devices inside the housing 90 with both the technician and the electronic devices protected from adverse weather conditions. The shields 108, 188 may be transitioned from an open position to a closed position in a similar manner as the transition from a closed position to an open position.

While several embodiments of the invention have been described, it should be apparent, however, that various modifications, alterations and adaptations to those embodiments may occur to persons skilled in the art with the attainment of some or all of the advantages of the present invention. For example, although FIGS. 4–8 depict embodiments as having multiple track compression members 166, 168, 170, 172 raising and supporting at least one shield 108, 188, those skilled in the art will appreciate that a single track compression member may be utilized in raising and supporting at least one shield. The described embodiments are therefore intended to cover all such modifications, alterations and adaptations without departing from the scope and spirit of the present invention as defined by the appended claims.

What is claimed is:

1. An enclosure adapted for housing an electronic device, comprising:
    a housing;
    at least one door pivotally connected to the housing, wherein the at least one door is pivotally moveable between a closed position and an open position about a first pivot axis; and
    at least one shield connected to the housing, wherein the at least one shield is pivotally moveable between a closed position and an open position about a second pivot axis, and wherein the at least one shield is adapted to protect the enclosure from adverse environmental conditions,
    wherein the second pivot axis is defined by a hinge and a cross member, and
    wherein the enclosure further comprises:
    at least one bracket, wherein the at least one bracket is included in at least one lateral portion of the housing and configured to support the hinge and the cross member.

2. The enclosure of claim 1, wherein the at least one bracket comprises a fixed member and a moveable member.

3. The enclosure of claim 1, wherein the at least one bracket comprises a fixed member.

4. An enclosure adapted for housing an electronic device, comprising:
    a housing;
    a shield further comprising a U-channel body having a top surface and first, second, and third lateral portions, wherein the shield is coupled to the housing and is pivotally moveable between a closed position and an open position about a pivot axis, and wherein the shield is adapted to protect the enclosure from adverse environmental conditions,
    wherein the pivot axis is defined by a hinge and a cross member, and
    wherein the hinge and the cross member are supported by at least one bracket, wherein the at least one bracket is included in at least one lateral portion of the housing.

5. The shield of claim 4, wherein the at least one bracket comprises a fixed member and a moveable member.

6. The shield of claim 4, wherein the at least one bracket comprises a fixed member.

* * * * *